United States Patent
Yamada et al.

(10) Patent No.: US 11,855,448 B2
(45) Date of Patent: Dec. 26, 2023

(54) CONTROL DEVICE AND FAILURE DETERMINATION METHOD FOR DETERMINING A FAILURE IN A SWITCHING CIRCUIT

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kei Yamada, Yokkaichi (JP); Ken Furuto, Yokkaichi (JP); Takanori Ito, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 286 days.

(21) Appl. No.: 17/413,016

(22) PCT Filed: Dec. 11, 2019

(86) PCT No.: PCT/JP2019/048397
§ 371 (c)(1),
(2) Date: Jun. 11, 2021

(87) PCT Pub. No.: WO2020/122099
PCT Pub. Date: Jun. 18, 2020

(65) Prior Publication Data
US 2022/0294209 A1     Sep. 15, 2022

(30) Foreign Application Priority Data
Dec. 11, 2018  (JP) ................. 2018-231892

(51) Int. Cl.
*H02H 7/20* (2006.01)
*B60R 16/02* (2006.01)
*H02H 1/00* (2006.01)

(52) U.S. Cl.
CPC ............... *H02H 7/20* (2013.01); *B60R 16/02* (2013.01); *H02H 1/0007* (2013.01)

(58) Field of Classification Search
CPC ......... B60L 50/40; B60R 16/02; B60R 16/03; B60R 16/033; F02N 11/08;
(Continued)

(56) References Cited

U.S. PATENT DOCUMENTS 7,573,151 B2 * 8/2009 Acena .................... B60L 50/40
                                                        307/9.1
9,458,813 B2 * 10/2016 Sekiguchi ............... B60R 16/03
(Continued)

FOREIGN PATENT DOCUMENTS

JP   2005-039385 A    2/2005
JP   2015009742 A *   1/2015 .............. B60L 58/20
(Continued)

OTHER PUBLICATIONS

International Search Report, Application No. PCT/JP2019/048397, dated Mar. 3, 2020. ISA/Japan Patent Office.

*Primary Examiner* — Jared Fureman
*Assistant Examiner* — Nicolas Bellido
(74) *Attorney, Agent, or Firm* — Honigman LLP

(57) ABSTRACT

Provided is a vehicular control device that is provided with a switching circuit, and for opening/closing a connection between a starter including a capacitor that is to be connected to one end portion of the switching circuit and an in-vehicle battery that is to be connected to another end portion of the switching circuit by controlling an on/off state of the switching circuit. The control device includes a
(Continued)

voltage detection unit configured to detect a voltage of the one end portion, and a control unit configured to control the switching circuit to turn off from on, and determine whether there is a failure in the switching circuit, based on a voltage detected by the voltage detection unit when a predetermined time has elapsed from when the switching circuit is controlled to turn off from on.

15 Claims, 13 Drawing Sheets

(58) Field of Classification Search
CPC ............... F02N 11/0866; F02N 11/087; F02N 2011/0885; F02N 2200/063; H02H 1/0007; H02H 7/0844; H02H 7/20; H02J 2310/46; H03K 17/00; H03K 17/122; H03K 17/18; H03K 17/687; H03K 17/693; Y02T 10/70
See application file for complete search history.

(56) References Cited

U.S. PATENT DOCUMENTS

| | | | |
|---|---|---|---|
| 11,705,806 B2* | 7/2023 | Wakazono | ......... H03K 17/0822 307/10.6 |
| 2009/0096285 A1 | 4/2009 | Acena et al. | |
| 2015/0001857 A1 | 1/2015 | Sekiguchi | |
| 2015/0239411 A1 | 8/2015 | Nakajima et al. | |
| 2017/0279443 A1 | 9/2017 | Morimoto | |
| 2022/0170437 A1* | 6/2022 | Wakazono | ......... H03K 17/0822 |

FOREIGN PATENT DOCUMENTS

| | | | | |
|---|---|---|---|---|
| JP | 2015009743 A | * | 1/2015 | ............. B60L 58/20 |
| WO | WO-2020217958 A1 | * | 10/2020 | ............. F02N 11/04 |

* cited by examiner

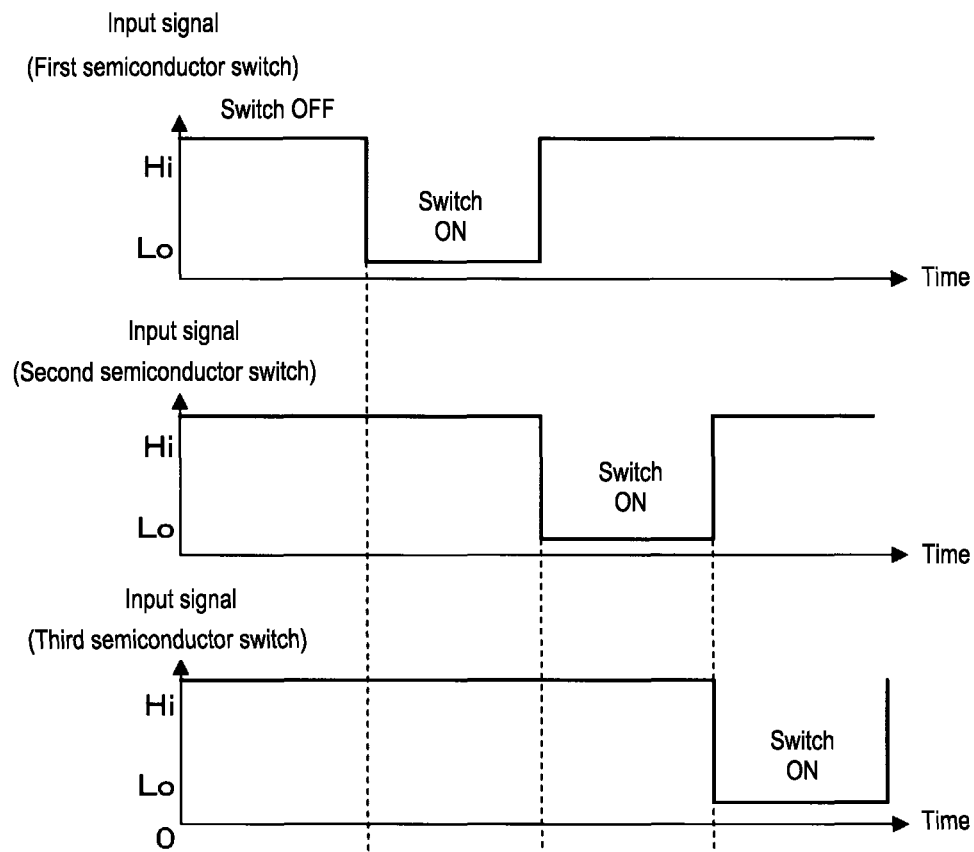
FIG. 7A
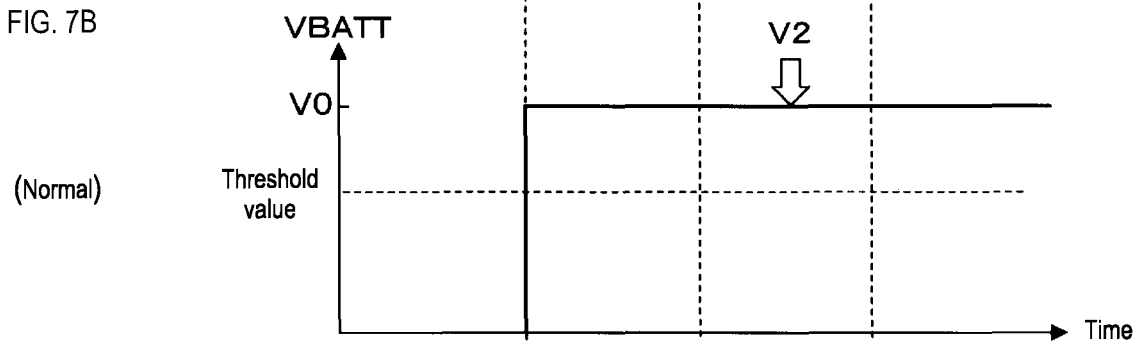
FIG. 7B (Normal)
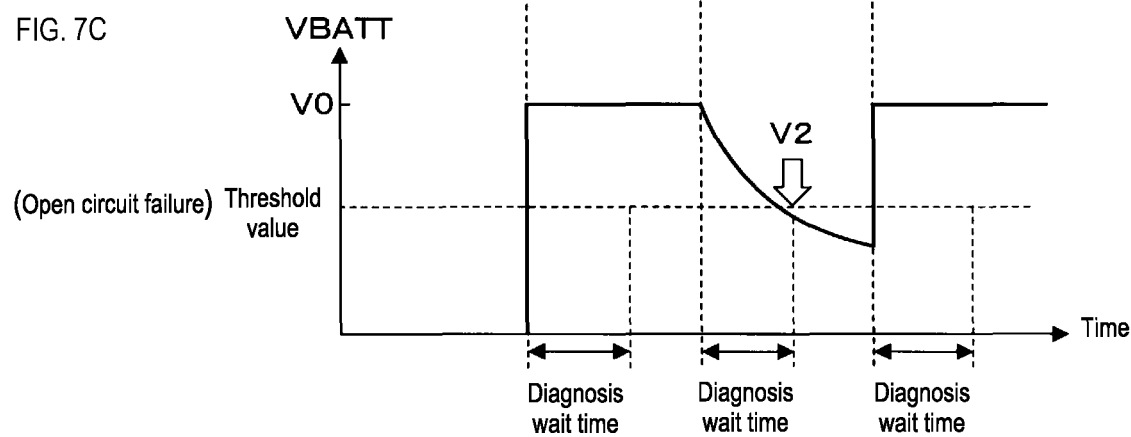
FIG. 7C (Open circuit failure)

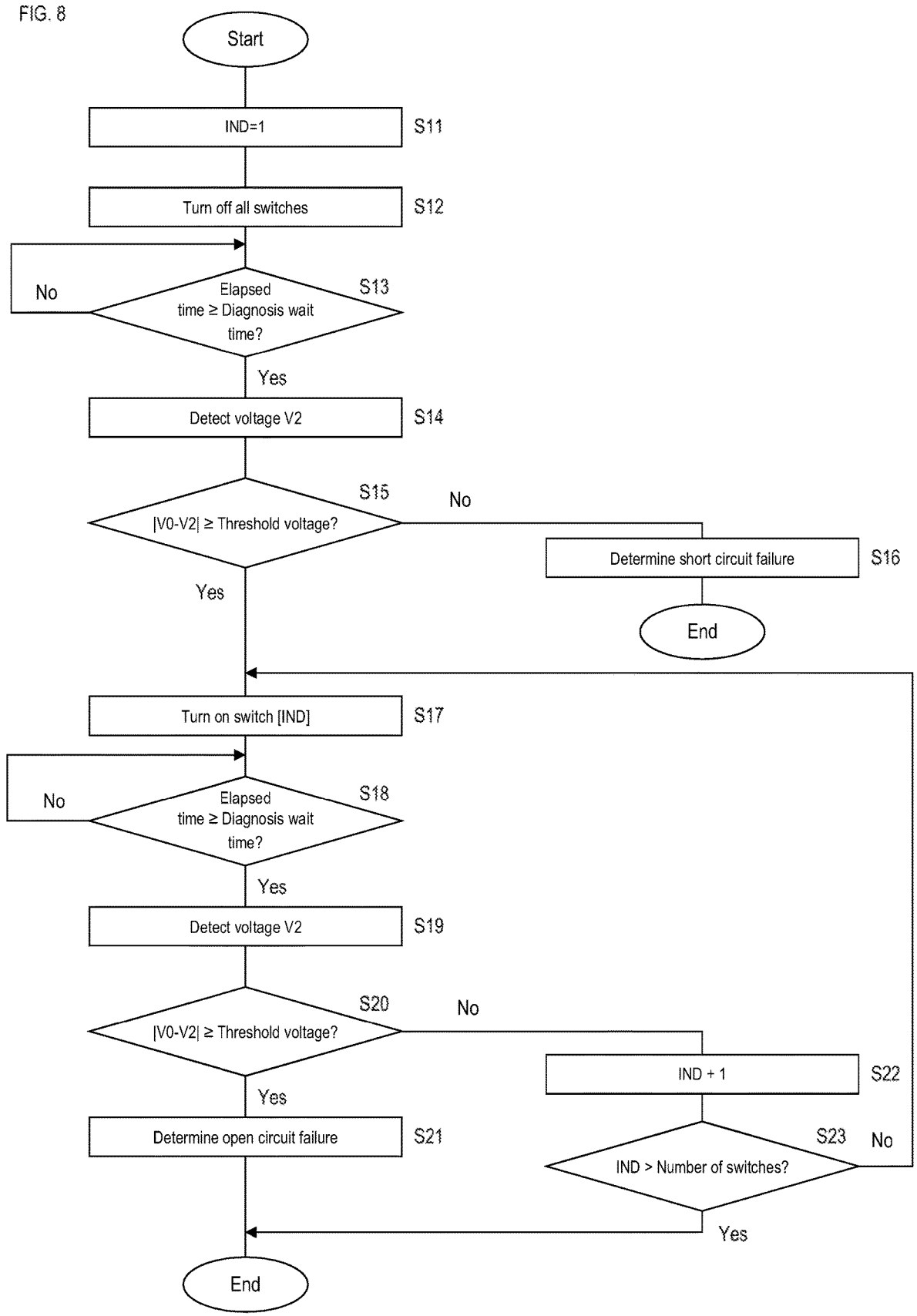

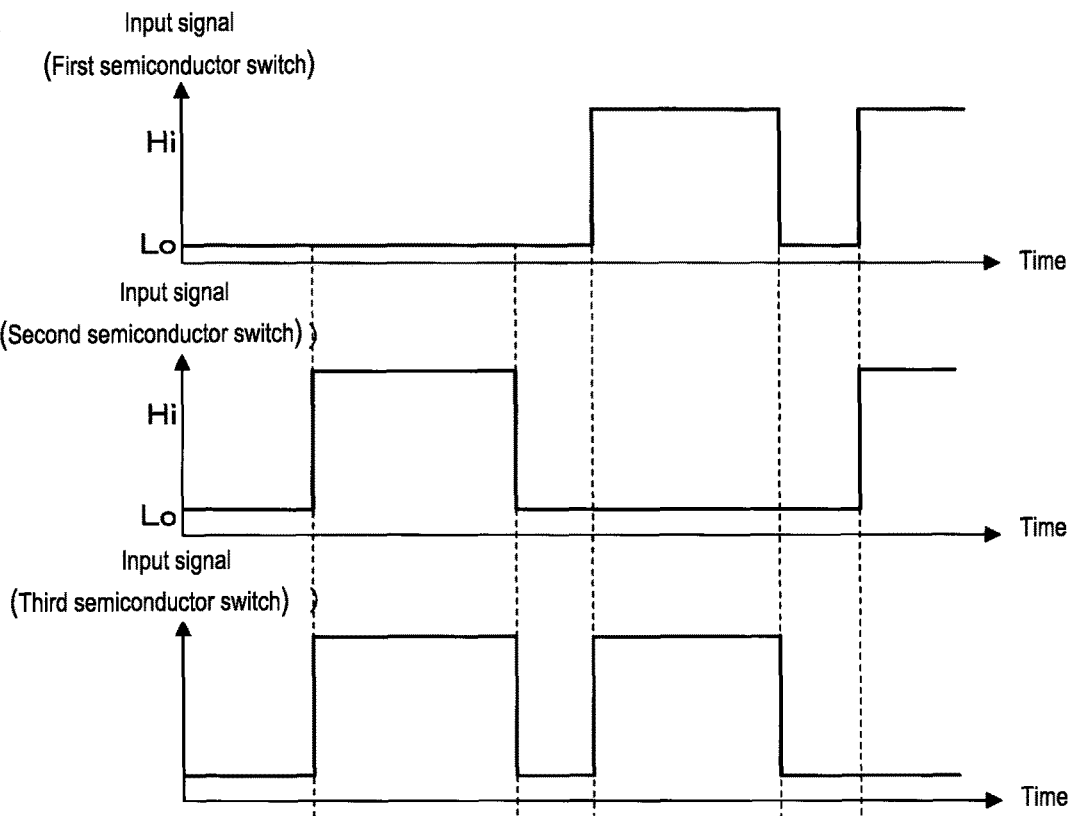
FIG. 10A
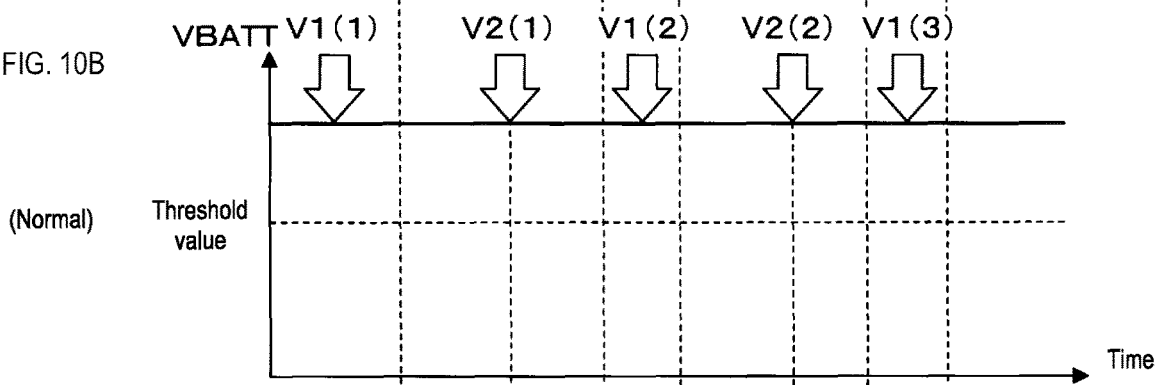
FIG. 10B (Normal)
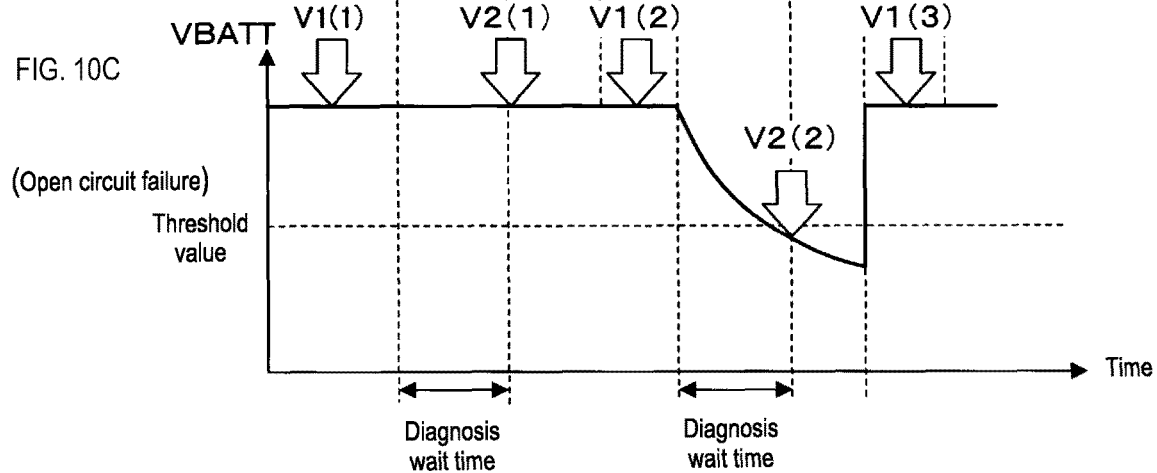
FIG. 10C (Open circuit failure)

CONTROL DEVICE AND FAILURE DETERMINATION METHOD FOR DETERMINING A FAILURE IN A SWITCHING CIRCUIT

CROSS-REFERENCE TO RELATED APPLICATIONS

This application is the U.S. national stage of PCT/JP2019/048397 filed on Dec. 11, 2019, which claims priority of Japanese Patent Application No. JP 2018-231892 filed on Dec. 11, 2018, the contents of which are incorporated herein.

TECHNICAL FIELD

The present disclosure relates to a control device and a failure determination method.

BACKGROUND

JP 2005-39385A discloses a vehicular control device constituted by providing a failure diagnostic unit in each of a plurality of semiconductor switches in a switching circuit constituted by arranging the semiconductor switches in parallel in order to control a large current to be supplied to a load. The failure diagnosis unit diagnoses whether there is a malfunction in a semiconductor switch by determining the consistency between an on/off control signal that is input to the semiconductor switch and an output level of the semiconductor switch.

In the vehicular control device according to JP 2005-39385A, when a capacitor is connected to a circuit to be controlled to open/close, if the capacity of the capacitor is large, there are technical problems in that it takes time to discharge the capacitor, and it takes time to diagnose a failure in the switching circuit.

For example, when the connection between a starter having a capacitor and an in-vehicle battery is opened/closed using a switching circuit, even when the switching circuit in an on state turns off, it takes time for the capacitor to be discharged and the voltage to drop, and as a result, it takes time to diagnose whether the switching circuit is operating normally.

An object of the present disclosure is to provide a control device and a failure determination method according to which, in a case in which a capacitor is connected to a circuit to be controlled to open/close, it is possible to quickly determine whether there is a failure in a switching circuit without waiting until the capacitor is completely discharged.

SUMMARY

A control device according to an aspect is a vehicular control device provided with a switching circuit and for opening/closing a connection between a starter including a capacitor that is to be connected to one end portion of the switching circuit and an in-vehicle battery that is to be connected to another end portion of the switching circuit by controlling an on/off state of the switching circuit, the control device including a voltage detection unit configured to detect a voltage of the one end portion, and a control unit configured to control the switching circuit to turn off from on, and determine whether there is a failure in the switching circuit, based on a voltage detected by the voltage detection unit when a predetermined time has elapsed from when the switching circuit is controlled to turn off from on.

A failure determination method according to an aspect is a failure determination method for determining a failure in a vehicular control device provided with a switching circuit and for opening/closing a connection between a starter including a capacitor that is to be connected to one end portion of the switching circuit and an in-vehicle battery that is to be connected to another end portion of the switching circuit by controlling an on/off state of the switching circuit, the method including a step of controlling the switching circuit to turn off from on, a step of detecting a voltage of the one end portion when a predetermined time has elapsed from when the switching circuit is controlled to turn off from on, and a step of determining whether there is a failure in the switching circuit based on the detected voltage.

Effects of Present Disclosure

According to the present disclosure, a control device and a failure determination method can be provided according to which, in a case in which a capacitor is connected to a circuit to be controlled to open/close, it is possible to quickly determine whether there is a failure in a switching circuit without waiting until the capacitor is completely discharged.

BRIEF DESCRIPTION OF DRAWINGS

FIG. 7A shows timing charts illustrating a diagnostic method of an open circuit failure, showing the voltage level of input signals that are output from the control unit.

FIG. 7B shows timing charts illustrating a diagnostic method of an open circuit failure, showing the change in voltage when the first to third semiconductor switches are normal.

FIG. 7C shows timing charts illustrating a diagnostic method of an open circuit failure, showing a change in the voltage when there is an open circuit failure in the second semiconductor.

FIG. 8 is a flowchart illustrating a processing procedure of the failure determination method according to the first embodiment.

FIG. 10A shows timing charts illustrating a diagnostic method of an open circuit failure according to the second embodiment, showing the voltage level of input signals that are output from the control unit.

FIG. 10B shows timing charts illustrating a diagnostic method of an open circuit failure, showing the change in voltage when the first to third semiconductor switches are normal.

FIG. 10C shows timing charts illustrating a diagnostic method of an open circuit failure, showing a change in the voltage when there is an open circuit failure in the second semiconductor.

DETAILED DESCRIPTION OF PREFERRED EMBODIMENTS

Figure 1:
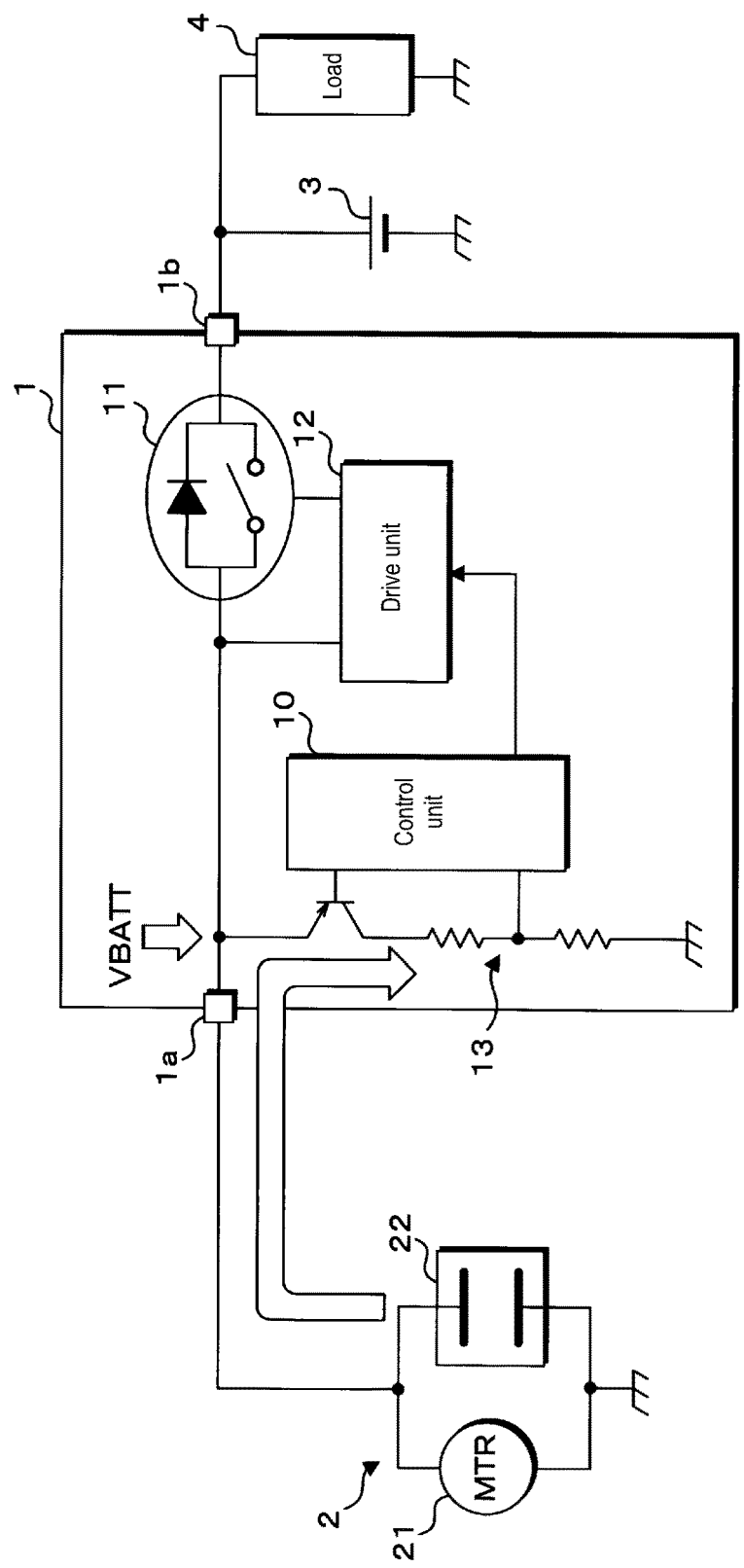
FIG. 1 is a circuit block diagram illustrating an exemplary configuration of a vehicular current control system according to a first embodiment.

First, embodiments of the present disclosure will be listed and illustrated. At least some of the embodiments to be described below may be combined as appropriate.

A control device according to an aspect is a vehicular control device provided with a switching circuit and for opening/closing a connection between a starter including a capacitor that is to be connected to one end portion of the switching circuit and an in-vehicle battery that is to be connected to another end portion of the switching circuit by controlling an on/off state of the switching circuit, the control device including a voltage detection unit configured to detect a voltage of the one end portion, and a control unit configured to control the switching circuit to turn off from on, and determine whether there is a failure in the switching circuit, based on a voltage detected by the voltage detection unit when a predetermined time has elapsed from when the switching circuit is controlled to turn off from on.

In this aspect, the control unit can determine whether there is a failure in the switching circuit in a short time. For example, due to a predetermined time being set to a time shorter than the time required for the capacitor that is charged by the in-vehicle battery to be completely discharged, the control unit can determine whether there is a failure in the switching circuit in a time shorter than the time required for the capacitor that is charged through the in-vehicle battery to be completely discharged.

When determining whether there is a failure in the switching circuit, the control unit controls the switching circuit to turn off from on. When the switching circuit is on, the capacitor and the in-vehicle battery are connected to each other, and the capacitor is in a charged state. When the switching circuit is switched off normally due to the above control on the switching circuit, the capacitor is disconnected from the in-vehicle battery, the capacitor starts discharging, and the voltage of the one end portion of the switching circuit drops.

When the capacitor discharges and the voltage of the one end portion of the switching circuit drops to a reference potential, it is possible to determine that the switching circuit has been controlled to turn off from on normally. However, the larger the capacity of the capacitor is, the longer it takes for the capacitor to be discharged, and it also takes time to determine whether there is a failure in the switching circuit.

In view of this, in this aspect, the control unit determines whether there is a failure in the switching circuit, based on the voltage of the one end portion of the switching circuit when a predetermined time has elapsed from when the switching circuit is controlled to turn off from on. The predetermined time is shorter than a time required for the capacitor that is charged by the in-vehicle battery to be completely discharged. The threshold value is the voltage of the capacitor when the predetermined time has elapsed from when the switching circuit is controlled to turn off from on, for example, and a numerical value used to determine whether the switching circuit has turned off from on normally.

Accordingly, the control unit can determine whether there is a failure in the switching circuit before a predetermined time elapses, that is, before the capacitor is completely discharged.

A configuration is preferable in which the switching circuit includes a plurality of semiconductor switches connected in parallel, the control unit is configured to open/close the connection between the starter and the in-vehicle battery by simultaneously turning on/off the plurality of semiconductor switches, and the control unit controls all or some of the plurality of semiconductor switches to turn off from on in a state in which the switching circuit is on, and determines whether there is a failure in the plurality of semiconductor switches, based on a voltage detected by the voltage detection unit when the predetermined time has elapsed from when all or some of the plurality of semiconductor switches are controlled to turn off from on.

In this aspect, the switching circuit includes the plurality of semiconductor switches connected in parallel. For this reason, the control device can open/close the circuit through which a large current that cannot be controlled using one semiconductor switch flows. The control unit can determine whether there is a failure in the plurality of semiconductor switches.

A configuration is preferable in which the control unit controls the plurality of semiconductor switches to turn off in the state in which the switching circuit is on, and, if the voltage detected by the voltage detection unit when the predetermined time has elapsed from when the plurality of semiconductor switches are controlled to turn off is greater than a predetermined threshold value, determines that there is a short circuit failure in which the semiconductor switches have short-circuited.

In this aspect, it is possible to determine whether there is a short circuit failure in the semiconductor switches.

A configuration is preferable in which the control unit controls the plurality of semiconductor switches to turn off in the state in which the switching circuit is on, and, if a difference between a voltage detected by the voltage detection unit in the state in which the switching circuit is on and a voltage detected by the voltage detection unit when the predetermined time has elapsed from when the plurality of semiconductor switches are controlled to turn off is less than a predetermined threshold voltage, determines that there is a short circuit failure in which the semiconductor switches have short-circuited.

In this aspect, it is possible to determine whether there is a short circuit failure in the semiconductor switches regardless of the voltage level of the in-vehicle battery.

A configuration is preferable in which the control unit controls one of the semiconductor switches to turn on and the other semiconductor switches to turn off, and, if a voltage detected by the voltage detection unit when the predetermined time has elapsed from when the one semiconductor switch is controlled to turn on is less than a predetermined threshold value, determines that there is an open circuit failure in which the one semiconductor switch does not turn on.

In this aspect, it is possible to determine whether there is an open circuit failure in the semiconductor switches.

A configuration is preferable in which the control unit controls one of the semiconductor switches to turn on and the other semiconductor switches to turn off, and, if a difference between a voltage detected by the voltage detection unit in the state in which the switching circuit is on and a voltage detected by the voltage detection unit when a predetermined time has elapsed from when the one semiconductor switch is controlled to turn on is a predetermined threshold voltage or more, determines that there is an open circuit failure in which the one semiconductor switch does not turn on.

In this aspect, it is possible to determine whether there is an open circuit failure in the semiconductor switches regardless of the voltage level of the in-vehicle battery.

A configuration is preferable in which the control unit determines an open circuit failure for each of the plurality of semiconductor switches by selectively controlling each of the semiconductor switches to turn on one by one.

In this aspect, it is possible to determine whether there is an open circuit failure for each of the plurality of semiconductor switches.

A configuration is preferable in which the control unit sets a length of the predetermined time, based on a voltage detected by the voltage detection unit in the state in which the switching circuit is on.

In this aspect, it is possible to determine whether there is a failure in the semiconductor switches using a predetermined time according to the voltage level of the in-vehicle battery.

A configuration is preferable in which the greater the voltage detected by the voltage detection unit in the state in which the switching circuit is on is, the shorter the control unit sets the length of the predetermined time.

In this aspect, it is possible to determine whether there is a failure in the semiconductor switches more quickly using a predetermined time according to the voltage level of the in-vehicle battery.

A failure determination method according to an aspect is a failure determination method for determining a failure in a vehicular control device provided with a switching circuit and for opening/closing a connection between a starter including a capacitor that is to be connected to one end portion of the switching circuit and an in-vehicle battery that is to be connected to another end portion of the switching circuit by controlling an on/off state of the switching circuit, the method including a step of controlling the switching circuit to turn off from on, a step of detecting a voltage of the one end portion when a predetermined time has elapsed from when the switching circuit is controlled to turn off from on, and a step of determining whether there is a failure in the switching circuit based on the detected voltage.

In this aspect, similarly to aspect (1), it is possible to determine whether there is a failure in the switching circuit in a time shorter than the time required for the capacitor that is charged by the in-vehicle battery to be completely discharged.

A configuration is preferable in which the control unit determines whether there is a failure in the plurality of semiconductor switches by comparing a predetermined threshold voltage with a difference between a voltage detected by the voltage detection unit in a state where the switching circuit is on and a voltage detected by the voltage detection unit when the predetermined time has elapsed from all or some of the plurality of semiconductor switches are controlled to turn off from on.

In this aspect, it is possible to determine whether there is a failure in the semiconductor switches regardless of the voltage level of the in-vehicle battery.

Specific examples of a control device and a failure determination method according to embodiments of the present disclosure will be described below with reference to the drawings. Note that the present invention is not limited to these illustrative examples, and is indicated by the claims, and all changes that come within the meaning and range of equivalency of the claims are intended to be embraced therein.

Hereinafter, the present disclosure will be specifically described based on the drawings illustrating embodiments thereof.

First Embodiment

FIG. 1 is a circuit block diagram illustrating an exemplary configuration of a vehicle current control system according to a first embodiment. The vehicle current control system according to the first embodiment includes a vehicular control device 1, a starter generator 2, an in-vehicle battery 3, and a load 4. The control device 1 includes a control unit 10, a switching circuit 11, a drive unit 12, and a voltage detection unit 13. A first terminal 1a is connected to one end portion of the switching circuit 11, and a second terminal 1b is connected to another end portion of the switching circuit 11. The first terminal 1a is connected to one end portion of the starter generator 2, and another end portion of the starter generator 2 is grounded. The starter generator 2 has a power generation function in addition to a starter function for starting a vehicle engine, and includes a motor 21 for starting the engine, and a capacitor 22. One end portion of the capacitor 22 is connected to the first terminal 1a, and another end portion of the capacitor 22 is grounded. The positive electrode of the in-vehicle battery 3 is connected to the second terminal 1b, and the negative electrode of the in-vehicle battery 3 is grounded. Also, one end portion of the load 4 is connected to the second terminal 1b, and another end portion of the load 4 is grounded. The load 4 is an in-vehicle device such as an interior light, an air-conditioner, or a car navigation device.

In the vehicle current control system configured as above, the starter generator 2 is connected to the in-vehicle battery 3 and the load 4 via the control device 1. The control device 1 opens/closes the connection between the starter generator 2 and the in-vehicle battery 3.

When the vehicle engine is operating and the starter generator 2 is generating power, the starter generator 2 including the capacitor 22 and the in-vehicle battery 3 are connected to each other. Due to power generation by the starter generator 2, the in-vehicle battery 3 and the capacitor 22 are charged. Even when the starter generator 2 is not generating power, in the state in which the capacitor 22 and the in-vehicle battery 3 are connected to each other, the capacitor 22 is charged by the in-vehicle battery 3.

If the vehicle engine stops, the control device 1 opens the circuit, and disconnect the starter generator 2 and the in-vehicle battery 3 from each other. When starting the engine in this state, the motor 21 is driven using a starter battery (not shown) connected to the starter generator 2, and the engine is started. High power is required for the motor 21 to be driven, but since the starter generator 2 is disconnected from the in-vehicle battery 3 and the load 4, problems such as a drop of the voltage on the load 4 side can be avoided. When the engine starts, the control device 1 closes the circuit, and the starter generator 2 and the in-vehicle battery 3 are connected to each other.

Figure 2:
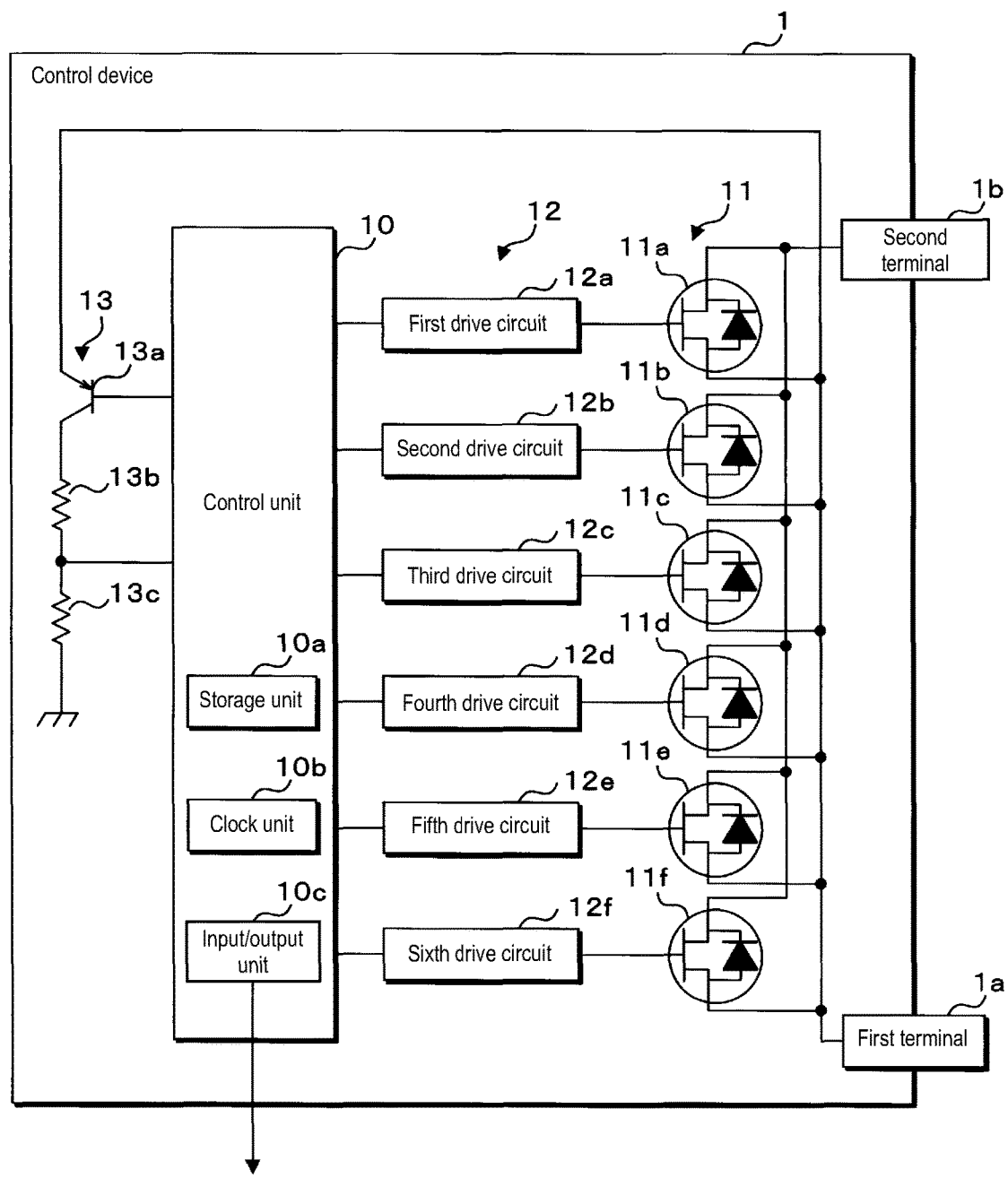
FIG. 2 is a block diagram illustrating an exemplary configuration of a control device.

FIG. 2 is a block diagram showing an exemplary configuration of the control device 1. The switching circuit 11 includes first to sixth semiconductor switches 11a, 11b, 11c, 11d, 11e, and 11f connected in parallel. MOSFETs (Metal-Oxide-Semiconductor Field-Effect Transistors), IGBTs (Insulated Gate Bipolar Transistors), or the like may be used as the first to sixth semiconductor switches 11a to 11f, for example. Hereinafter, the description will be given assuming that the first to sixth semiconductor switches 11a to 11f are N-channel MOSFETs. The drains of the first to sixth semiconductor switches 11a to 11f are connected to the second terminal 1b, and the sources thereof are connected to the first terminals 1a.

Note that, in the first embodiment, the switching circuit 11 formed by connecting six semiconductor switches in parallel is described, but the number of semiconductor switches is not particularly limited to six.

The drive unit 12 is provided with first to sixth drive circuits 12a, 112b, 12c, 12d, 12e, and 12f for switching on/off the first to sixth semiconductor switches 11a to 11f, and the operations thereof are controlled by the control unit 10. The output terminals of the first to sixth drive circuits 12a to 12f are connected to the gates of the first to sixth semiconductor switches 11a to 11f, and the first to sixth drive circuits 12a to 12f switch on/off the first to sixth semiconductor switches 11a to 11f by applying a gate drive voltage to the gates thereof.

The first drive circuit 12a is provided with a first transistor and a second transistor connected in series, for example, and the gate of the first semiconductor switch 11a is connected to a portion at which the first transistor and the second transistor are connected. When a low-level input signal is input from the control unit 10 to the first drive circuit 12a, the first and second transistors turn off, and the gate drive voltage for turning on the first semiconductor switch 11a is applied to the gate of the first semiconductor switch 11a. When a high-level input signal is input from the control unit 10 to the first drive circuit 12a, the first and second transistors turn on, and a gate drive voltage for turning off the first semiconductor switch 11a is applied to the gate of the first semiconductor switch 11a. The same applies to the operations of the other second to sixth drive circuits 12b, 12c, 12d, 12e, and 12f and second to sixth semiconductor switches 11b, 11c, 11d, 11e, and 11f.

The control unit 10 is a computer including a CPU (not shown), a storage unit 10a, a clock unit 10b, an input/output unit 10c, and the like. The storage unit 10a stores information used for determining whether there is a failure in the first to sixth semiconductor switches 11a to 11f. The detail of the information will be described later. The storage unit 10a stores failure diagnosis results of the first to sixth semiconductor switches 11a to 11f. The input/output unit 10c outputs, to the outside, signals or data indicating a failure of the first to sixth semiconductor switches 11a to 11f or whether there is a failure in the first to sixth semiconductor switches 11a to 11f.

The voltage detection unit 13 is provided with a transistor switch 13a and voltage-dividing resistors 13b and 13c connected in series, and one end of the series circuit is connected to the first terminal 1a, and another end thereof is grounded. The control unit 10 can detect the voltage of the first terminal 1a, that is, the first terminal 1a of the switching circuit 11, by turning on the transistor switch 13a and obtaining the divided voltage.

Figure 3A:
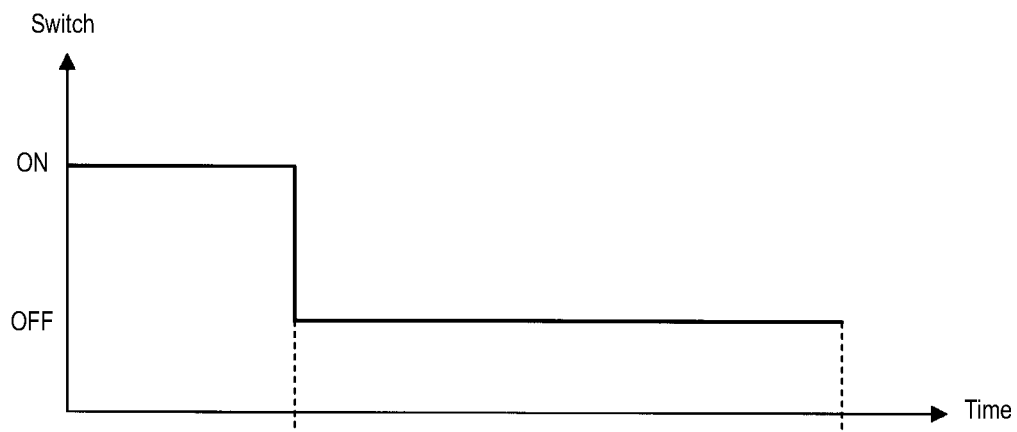
FIG. 3A is a timing chart illustrating a failure determination method according to the first embodiment, showing the on/off state of the switches.
Figure 3B:
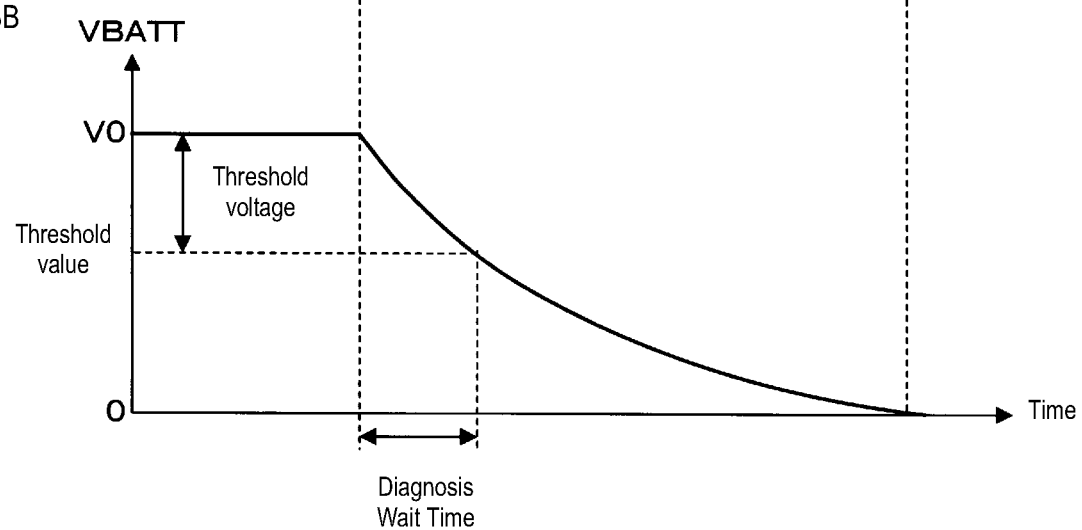
FIG. 3B shows the voltage of the first terminal detected by the voltage detection unit.

FIGS. 3A and 3B show timing charts illustrating a failure determination method according to the first embodiment. The horizontal axes represent time. The vertical axis in FIG. 3A represents an on/off state of the first to sixth semiconductor switches 11a to 11f, and the vertical axis in FIG. 3B represents a voltage VBATT of the first terminal 1a detected by the voltage detection unit 13. In FIG. 3B, a voltage V0 represents a predetermined voltage of the in-vehicle battery 3. The predetermined voltage is a rated voltage, and is a constant that does not change depending on the state of the in-vehicle battery 3.

If the first to sixth semiconductor switches 11a to 11f are in the on state, the voltage of the first terminal 1a is a predetermined voltage V0 of the in-vehicle battery 3, and the voltage of the capacitor 22 is also the voltage V0. If the first to sixth semiconductor switches 11a to 11f turn off from on, the capacitor 22 discharges (see the white arrow in FIG. 1) and the voltage VBATT of the first terminal 1a exponentially drops.

The predetermined time is a time shorter than the time required for the capacitor 22 that is charged through the in-vehicle battery 3 to be completely discharged.

A threshold voltage is the difference between the voltage V0 and the voltage VBATT of the first terminal 1a that is detected when a predetermined diagnosis wait time (a predetermined time) has elapsed from when the fully-charged capacitor 22 starts discharging. Also, a value obtained by subtracting the threshold voltage from the voltage V0 is referred to as a threshold value. The storage unit 10a of the control unit 10 stores the threshold voltage and diagnosis wait time.

Figure 4:
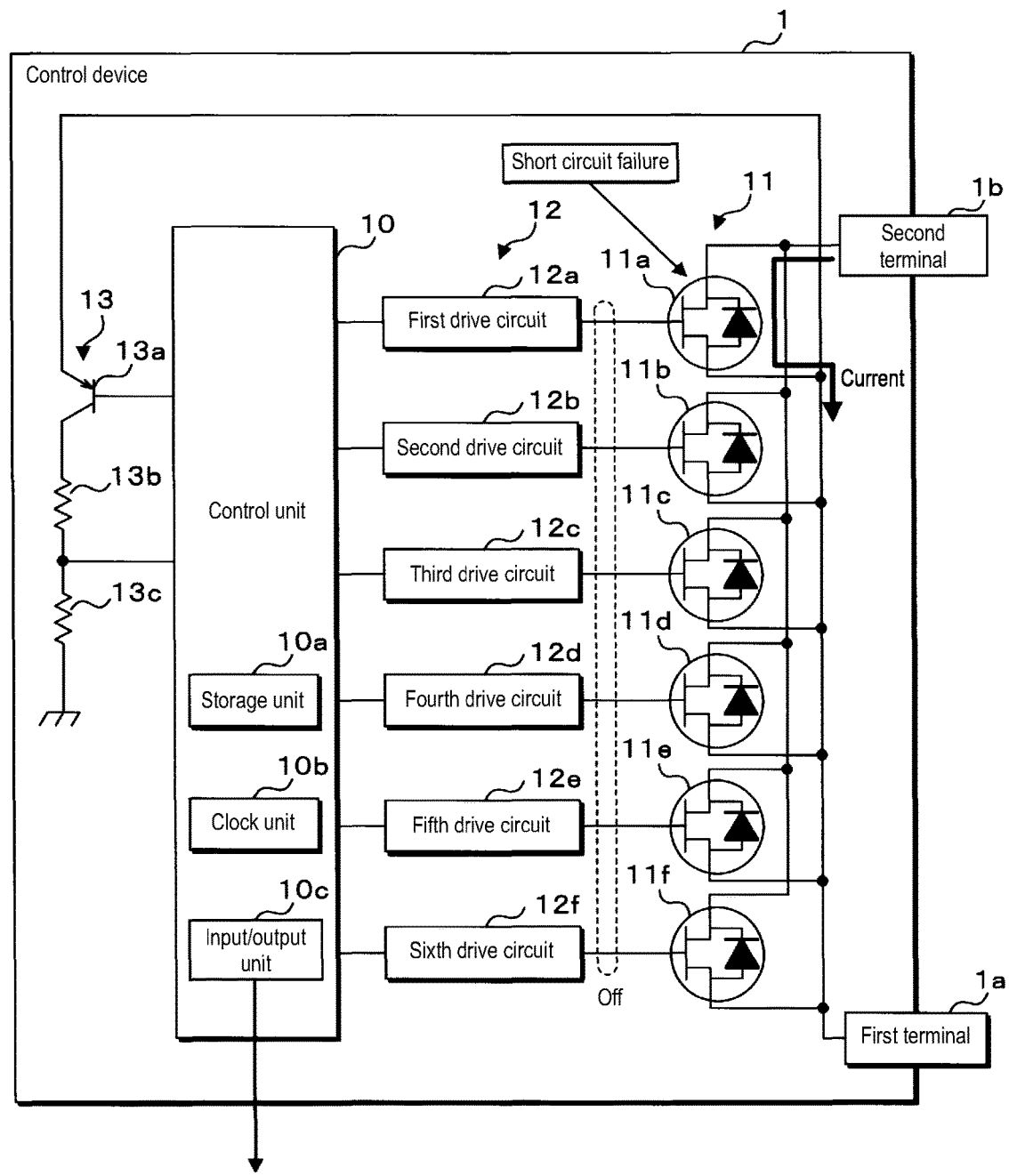
FIG. 4 is a diagram illustrating a diagnostic method of a short circuit failure.
Figure 5A:
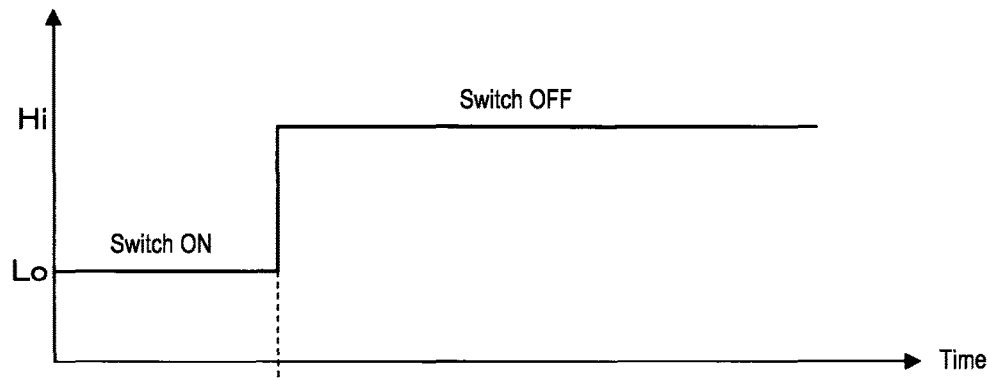
FIG. 5A shows timing charts illustrating a diagnostic method of a short circuit failure, showing the level of the voltage of input signals output from the control unit.
Figure 5B:
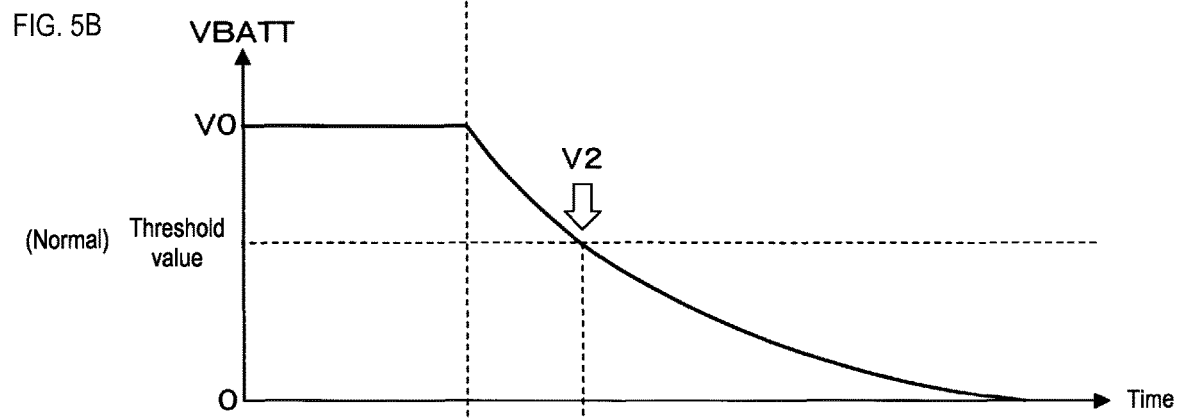
FIG. 5B shows timing charts illustrating a diagnostic method of a short circuit failure, showing the change in the voltage.
Figure 5C:
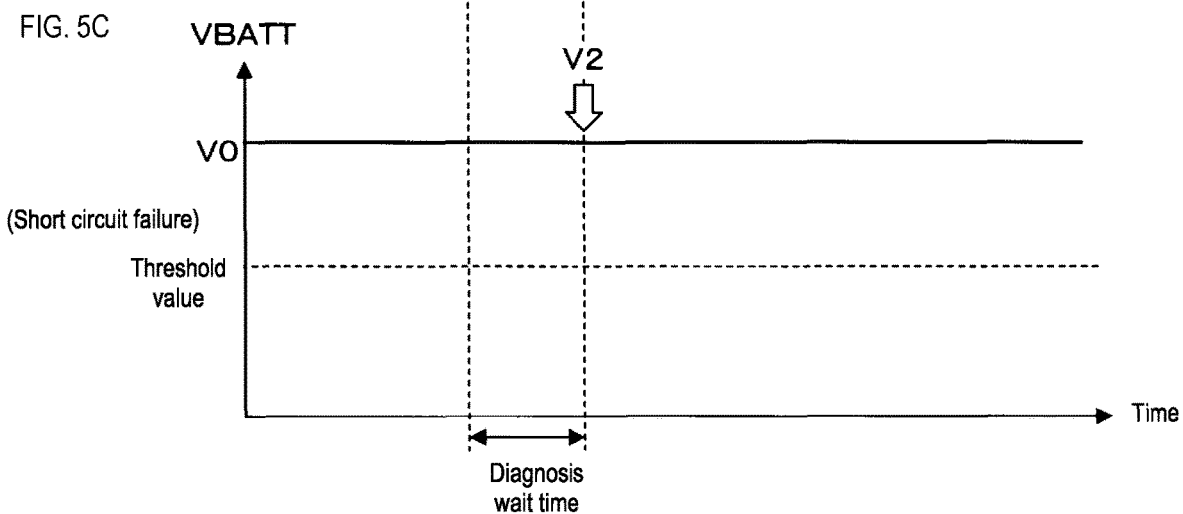
FIG. 5C shows timing charts illustrating a diagnostic method of a short circuit failure, showing a change in the voltage when there is a short circuit failure.

FIG. 4 is a diagram illustrating a diagnostic method of a short circuit failure, and FIG. 5 shows timing charts illustrating the diagnostic method of a short circuit failure. In FIG. 5, the horizontal axes represent time. The vertical axis in FIG. 5A represents the level of the voltage of input signals output from the control unit 10 to the first to sixth drive circuits 12a to 12f, and the vertical axes in FIG. 5B and FIG. 5C represent a voltage VBATT of the first terminal 1a. FIG. 5B shows a change in the voltage VBATT when the first to sixth semiconductor switches 11a to 11f are normal, and FIG. 5C shows a change in the voltage VBATT when there is a short circuit failure in any of the first to sixth semiconductor switches 11a to 11f.

When determining whether there is a short circuit failure, the control unit 10 controls all the first to sixth semiconductor switches 11a to 11f to turn off from on. When all the first to sixth semiconductor switches 11a to 11f turn off normally, the switching circuit 11 turns off. Accordingly, the capacitor 22 and the in-vehicle battery 3 are disconnected from each other, the capacitor 22 discharges, and as shown in FIG. 5B, the voltage of the capacitor 22 drops.

On the other hand, if there is a short circuit failure in any of the first to sixth semiconductor switches 11a to 11f, the switching circuit 11 does not turn off. Accordingly, the state in which the capacitor 22 and the in-vehicle battery 3 are connected is maintained, and as shown in FIG. 5C, the voltage of the capacitor 22 does not drop.

For this reason, the control unit 10 can determine whether there is a short circuit failure in the first to sixth semiconductor switches 11a to 11f using a voltage V2 of the first terminal 1a when a predetermined diagnosis wait time has elapsed from when the first to sixth semiconductor switches 11a to 11f are controlled to turn off from on.

Figure 6:
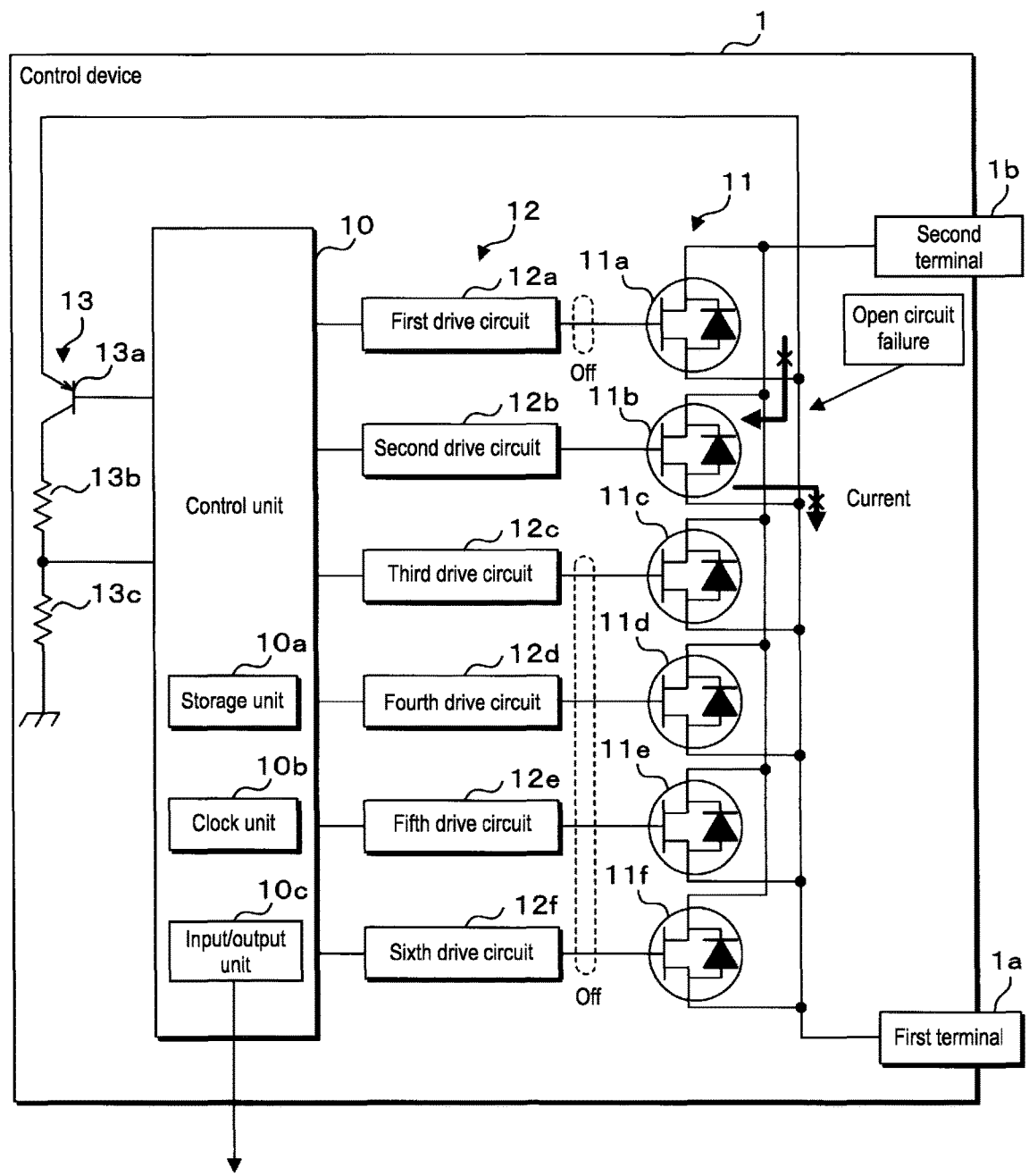
FIG. 6 is a diagram illustrating a diagnostic method of an open circuit failure.

FIG. 6 is a diagram illustrating a diagnostic method of an open circuit failure, and FIG. 7 shows timing charts illustrating a diagnostic method of an open circuit failure. Although the operations of the first to third semiconductor switches 11a, 11b, and 11c are shown here, the same applies to the operations of the fourth to sixth semiconductor switches 11d, 11e, and 11f. The vertical axis in FIG. 7A represents the voltage level of input signals that are output from the control unit 10 to the first drive circuit to the third drive circuit 12c, and the vertical axes in FIG. 7B and FIG. 7C represent the voltage VBATT of the first terminal 1a. FIG. 7B shows a change in the voltage VBATT when the first to third semiconductor switches 11a, 11b, and 11c are normal, and FIG. 7C shows a change in the voltage VBATT when there is an open circuit failure in the second semiconductor switch 11b.

When determining whether there is an open circuit failure, the control unit 10 controls any one of the first to sixth semiconductor switches 11a to 11f to turn on. For example, as shown in FIG. 7A, the control unit 10 controls only the first semiconductor switch 11a to turn on. The other second to sixth semiconductor switches 11b, 11c, 11d, 11e, and 11f are in the off state. When the first semiconductor switch 11a turns on normally, the capacitor 22 and the in-vehicle battery 3 are connected to each other, and the capacitor 22 is charged. Charging of the capacitor 22 is completed in a short time, and the battery of the capacitor 22 reaches the voltage of the in-vehicle battery 3. For this reason, as shown in FIG. 7B, the voltage of the first terminal 1a will be the voltage V0.

Similarly, next, the control unit 10 controls only the second semiconductor switch 11b to turn on. If there is an open circuit failure in the second semiconductor switch 11b, the switching circuit 11 does not turn on. Accordingly, the capacitor 22 and the in-vehicle battery 3 are disconnected from each other, the capacitor 22 discharges, and as shown in FIG. 7C, the voltage of the capacitor 22 drops.

For this reason, the control unit 10 can determine whether there is a short circuit failure in the second semiconductor switch 11b using the voltage V2 of the first terminal 1a when a predetermined diagnosis wait time has elapsed from when the second semiconductor switch 11b is controlled to turn on. Similarly, the control unit 10 can determine whether there is an open circuit failure in each of the first to sixth semiconductor switches 11a to 11f using the voltage V2 of the first terminal 1a when a predetermined diagnosis wait time has elapsed from when one of the first to sixth semiconductor switches 11a to 11f is controlled to turn on.

FIG. 8 is a flowchart illustrating processing procedures of a failure determination method according to the first embodiment. The control unit 10 substitutes 1 for a variable IND (step S11). The variable IND represents any one of the first to sixth semiconductor switches 11a to 11f by a numerical value. For example, the variable IND=1 represents the first semiconductor switch 11a, and the variable IND=2 represents the second semiconductor switch 11b.

Then, the control unit 10 controls the first to sixth semiconductor switches 11a to 11f to turn off from on (step S12). The control unit 10 determines whether the time elapsed from when the first to sixth semiconductor switches 11a to 11f are controlled to turn off from on is the predetermined diagnosis wait time or longer (step S13). If it is determined that the elapsed time is not the diagnosis wait time or longer than the diagnosis wait time (step S13: NO), the control unit 10 returns the processing to step S13, and continues the above diagnosis processing.

If it is determined that the elapsed time is the diagnosis wait time or longer (step S13: YES), the control unit 10 detects the voltage V2 using the voltage detection unit 13 (step S14). The voltage V2 represents the voltage VBATT of the first terminal 1a detected when the above diagnosis wait time has elapsed as shown in FIG. 5.

Next, the control unit 10 determines whether the absolute value of the difference between the voltage V0 of the in-vehicle battery 3 and the voltage V2 detected in step S14 is the threshold voltage or more (step S15). If it is determined that the absolute value is lower than the threshold voltage (step S15: NO), the control unit 10 diagnoses that there is a short circuit failure in the first to sixth semiconductor switches 11a to 11f (step S16), and ends the processing. If it is determined that the absolute value is the threshold voltage or more (step S15: YES), the control unit 10 controls the one of the first to sixth semiconductor switches 11a to 11f represented by the variable IND to turn on from off (step S17), and determines whether the elapsed time from when the semiconductor switches 11a to 11f are controlled to turn on is the predetermined diagnosis wait time or longer (step S18). If it is determined that the elapsed time is not longer than the diagnosis wait time (step S18: NO), the control unit 10 returns the processing to step S18, and continues the above diagnosis processing.

If it is determined that the elapsed time is the diagnosis wait time or longer (step S18: YES), the control unit 10 detects the voltage V2 using the voltage detection unit 13 (step S19).

Next, the control unit 10 determines whether the absolute value of the difference between the voltage V0 of the in-vehicle battery 3 and the voltage V2 detected in step S19 is the threshold voltage or more (step S20). If it is determined that the absolute value is the threshold voltage or more (step S20: YES), the control unit 10 diagnoses that there is an open circuit failure in one of the first to sixth semiconductor switches 11a to 11f represented by the variable IND (step S21), and ends the processing.

Note that an example in which the processing is ended if even one open circuit failure is discovered was described here, but a configuration is also possible in which it is respectively determined whether there is an open circuit failure for all of the first to sixth semiconductor switches 11a to 11f.

If it is determined that the absolute value is less than the threshold voltage in step S20 (step S20: NO), the control unit 10 increments the variable IND by 1 (step S22). Then, the control unit 10 determines whether the variable IND is greater than the number of the first to sixth semiconductor switches 11a to 11f (step S23). If the variable IND is not greater than the number of switches (step S23: NO), the control unit 10 returns the processing to step S17, and continues the diagnosis of an open circuit failure in the other first to sixth semiconductor switches 11a to 11f. If the variable IND is greater than the number of switches (step S23: YES), the control unit 10 ends the processing.

Note that it is favorable that the control unit 10 causes the storage unit 10a to store the failure determination result shown in FIG. 8. It is also favorable that the control unit 10 is configured to output, to the outside, the failure determination result via the input/output unit 10c.

Furthermore, the first embodiment described an example in which the control unit 10 determines whether the absolute value of the difference between the voltage V0 of the in-vehicle battery 3 and the voltage V2 detected in step S14 or step S19 is the threshold voltage or more, but a configuration is also possible in which the control unit 10 determines whether the voltage V2 detected in step S14 is a threshold value or less (see FIG. 3).

Specifically, a configuration is also possible in which, if the voltage V2 detected in step S14 is greater than a predetermined threshold value, the control unit 10 that executes the processing in step S15 determines that there is a short circuit failure in the first to sixth semiconductor switches 11a to 11f, and if the voltage V2 is the predetermined threshold value or less, the control unit 10 determines that there is no short circuit failure in the first to sixth semiconductor switches 11a to 11f.

A configuration is also possible in which, if the voltage V2 detected in step S19 is a predetermined threshold value or less, the control unit 10 that executes processing of step S20 determines that there is an open circuit failure in one of the first to sixth semiconductor switches 11a to 11f represented by the variable IND, and if the voltage V2 is greater than the threshold value, the control unit 10 determines that there is no open circuit failure in one of the first to sixth semiconductor switches 11a to 11f.

According to the control device 1 and the failure determination method according to the first embodiment configured as above, in the case in which the capacitor 22 is connected to the circuit to be controlled to open/close, it is possible to quickly determine whether there is a failure in the switching circuit 11 without waiting until the capacitor 22 is completely discharged.

Furthermore, it is possible to determine whether there is a short circuit failure and an open circuit failure in the first to sixth semiconductor switches 11a to 11f constituting the switching circuit 11. Note that the switching circuit 11 can open/close the circuit through which a large current that cannot be controlled by one semiconductor switch flows due to the switching circuit 11 being constituted by the first to sixth semiconductor switches 11a to 11f connected in parallel.

Furthermore, it is possible to determine whether there is an open circuit failure for each of the first to sixth semiconductor switches 11a to 11f.

Second Embodiment

In a control device 1 and a failure diagnostic method according to a second embodiment, since only the processing procedure regarding failure determination is different from that of the first embodiment, and the following description will be given focusing on the difference. Since the other processes, operations, and effects are the same as that of the first embodiment, the corresponding portions are given the same reference numerals and a detailed description thereof will be omitted.

Figure 9A:
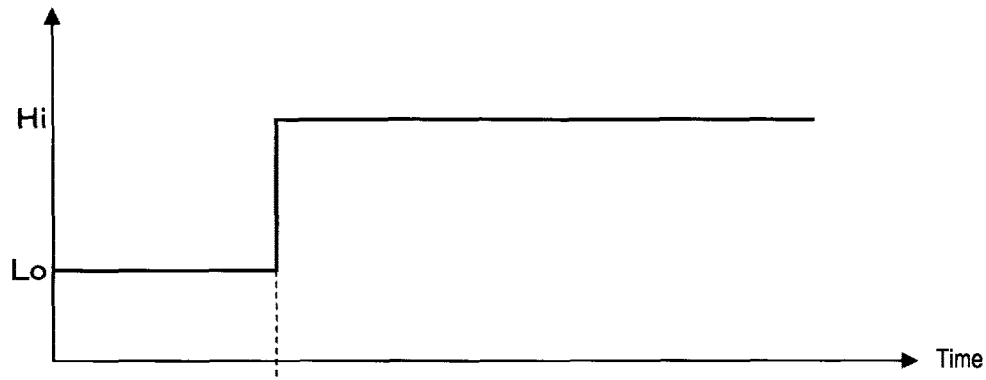
FIG. 9A shows timing charts illustrating a diagnostic method of a short circuit failure according to a second embodiment showing the voltage level of input signals that are output from the control unit.
Figure 9B:
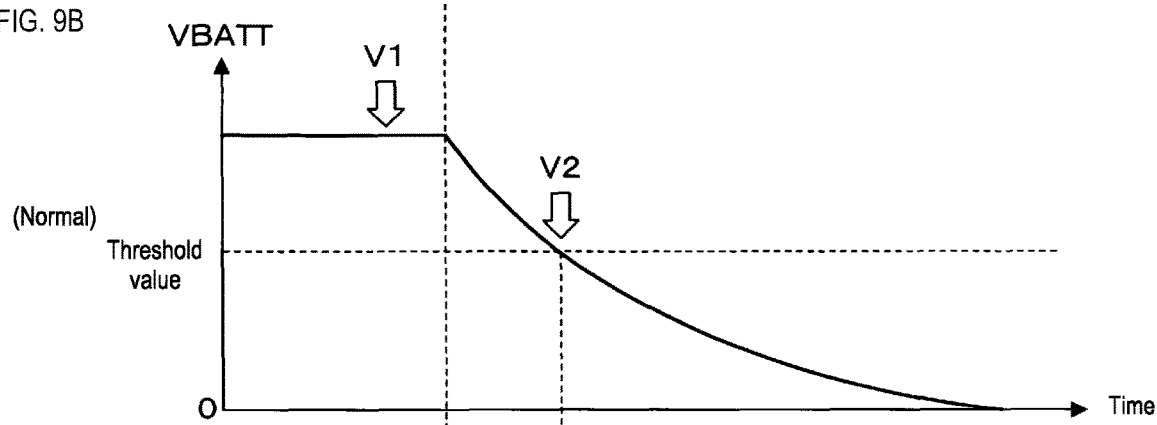
FIG. 9B shows timing charts illustrating a diagnostic method of a short circuit failure, showing the change in the voltage.
Figure 9C:
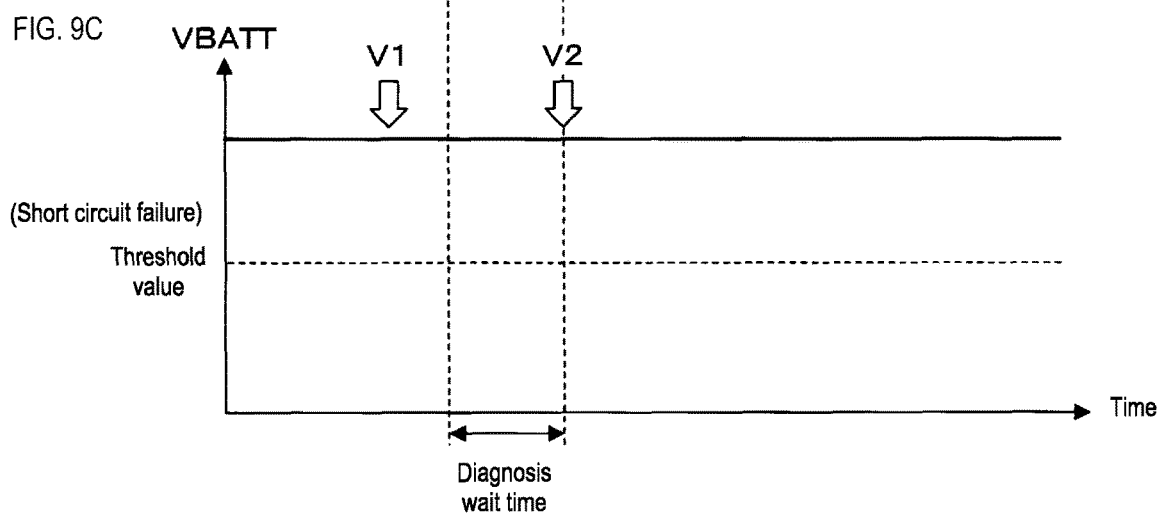
FIG. 9C shows timing charts illustrating a diagnostic method of a short circuit failure, showing a change in the voltage when there is a short circuit failure.

FIG. 9 shows timing charts illustrating a diagnostic method of a short circuit failure according to the second embodiment. FIG. 9A to FIG. 9C are diagrams similar to FIG. 5A to FIG. 5C. When determining whether there is a short circuit failure, first, the control unit 10 detects a voltage V1 of the first terminal 1a. In other words, the control unit 10 detects the current voltage of the in-vehicle battery 3. The control device 1 according to the second embodiment determines whether there is a failure in the switching circuit 11 using the voltage V1 of the in-vehicle battery 3 at the current point in time instead of the rated voltage V0 of the in-vehicle battery 3.

Similarly to the first embodiment, the control unit 10 controls the first to sixth semiconductor switches 11a to 11f to turn off from on. When all the first to sixth semiconductor switches 11a to 11f turn off normally, the capacitor 22 and the in-vehicle battery 3 are disconnected from each other, the capacitor 22 discharges, and as shown in FIG. 9B, the voltage of the capacitor 22, that is, the voltage VBATT of the first terminal 1a, drops. On the other hand, if there is a short circuit failure in any of the first to sixth semiconductor switches 11a to 11f, as shown in FIG. 9C, the voltage of the capacitor 22, that is, the voltage VBATT of the first terminal 1a, does not drop.

The control unit 10 can determine whether there is a short circuit failure in the first to sixth semiconductor switches 11a to 11f using the magnitude of the difference between the voltage V1 of the first terminal 1a before the switches are controlled and the voltage V2 of the first terminal 1a when a predetermined diagnosis wait time has elapsed from when the first to sixth semiconductor switches 11a to 11f are controlled to turn off from on.

FIG. 10 is a timing chart showing a diagnostic method of an open circuit failure according to the second embodiment. FIG. 10A, FIG. 10B, and FIG. 10C are diagrams similar to FIG. 7. In the second embodiment, whether there is an open circuit failure is determined in the similar manner to the first embodiment, however, the second embodiment is different from the first embodiment in that the voltage V1 of the first terminal 1a immediately before turning on each of the first to sixth semiconductor switches 11a to 11f is detected. Immediately before turning on each of the first to sixth semiconductor switches 11a to 11f one by one, as shown in FIG. 10A, the control unit 10 temporarily turns on all the first to sixth semiconductor switches 11a to 11f (input signals are low level Lo), and detects the voltage V1 of the first terminal 1a. The control unit 10 can determine whether there is an open circuit failure in each of the first to sixth semiconductor switches 11a to 11f using the magnitude of the difference between the voltage V1 of the first terminal 1a before the switches are controlled and the voltage V2 when a predetermined diagnosis wait time has elapsed from when one of the first to sixth semiconductor switches 11a to 11f are controlled to turn on.

Figure 11:
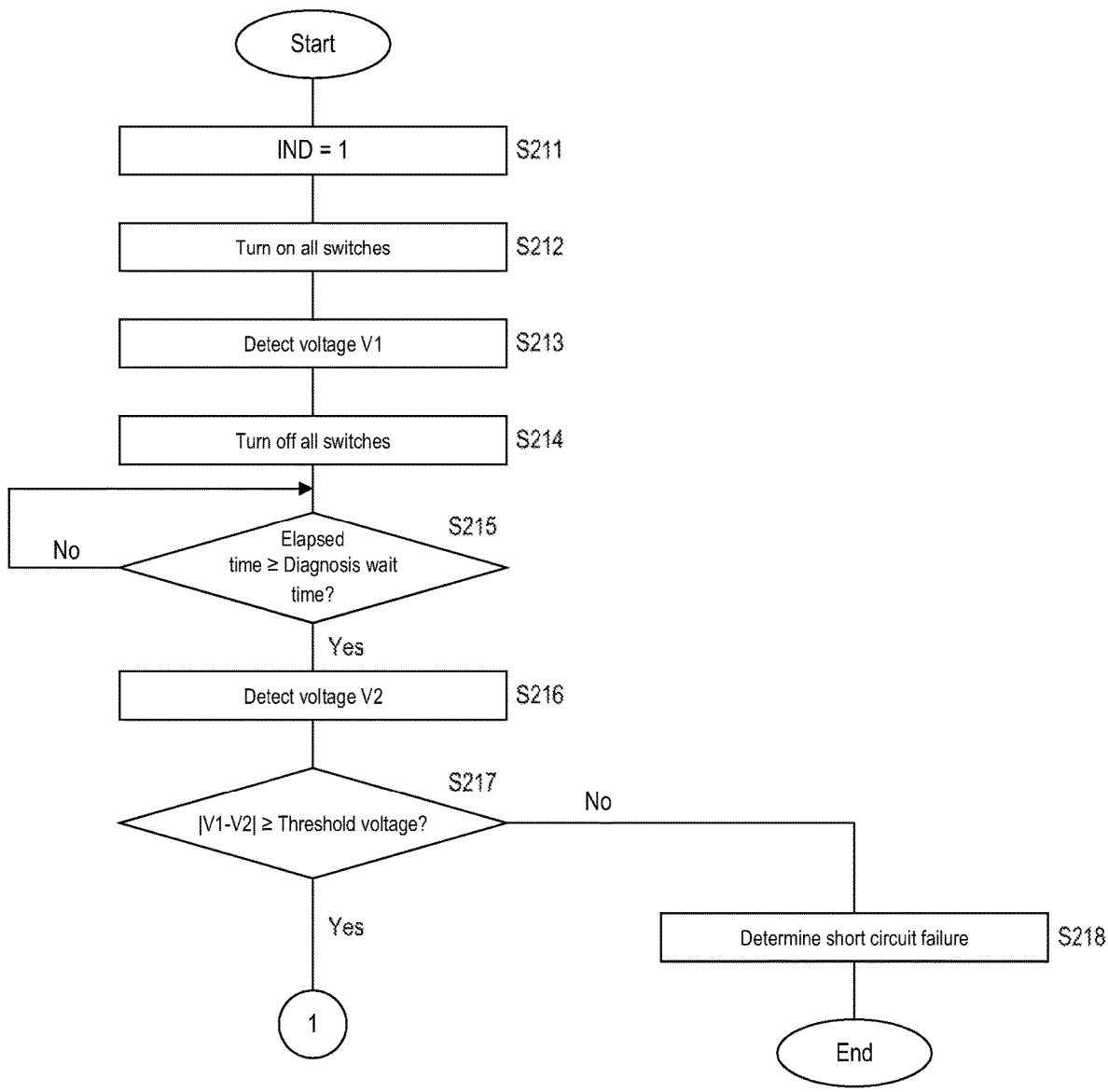
FIG. 11 is a flowchart illustrating processing procedures of a failure determination method according to the second embodiment.
Figure 12:
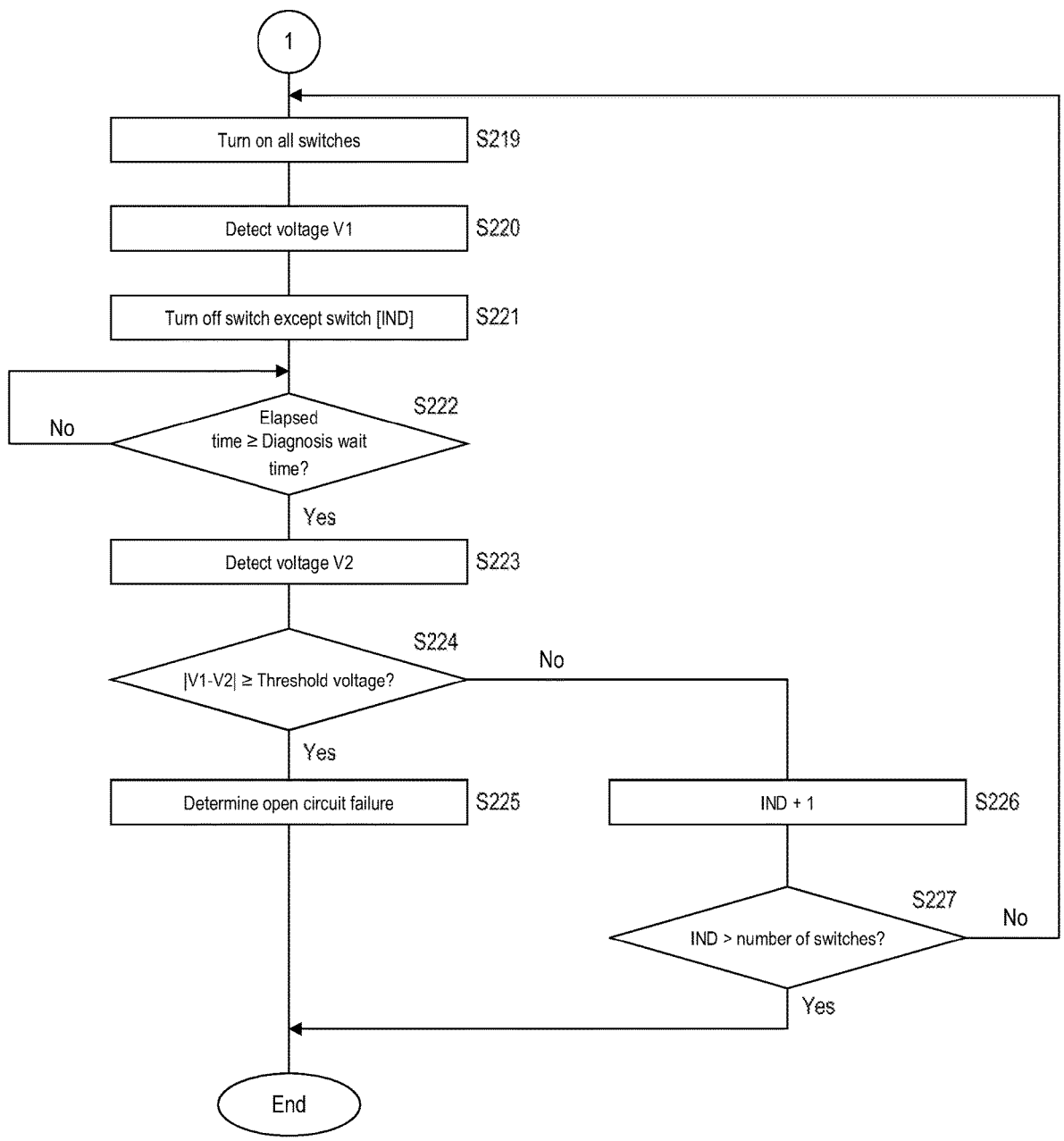
FIG. 12 is a flowchart illustrating processing procedures of the failure determination method according to the second embodiment.

FIG. 11 and FIG. 12 are flowcharts illustrating the processing procedure of the failure determination method according to the second embodiment. The control unit 10 substitutes 1 as the variable IND (step S211). Then, the control unit 10 turns on the first to sixth semiconductor switches 11a to 11f (step S212), and detects the voltage V1 of the first terminal 1a using the voltage detection unit 13 (step S213). Next, the control unit 10 detects the voltage of the first terminal 1a after a predetermined diagnosis wait time has elapsed by executing processing similar to steps S12 to S14 in the first embodiment in steps S214 to S216.

Next, the control unit 10 determines whether the absolute value of the difference between the voltage V1 detected in step S213 and the voltage V2 detected in step S216 is the threshold voltage or more (step S217). If it is determined that the absolute value is less than the threshold voltage (step S217: NO), the control unit 10 diagnoses that there is a short circuit failure in the first to sixth semiconductor switches 11a to 11f (step S218), and ends the processing. If it is determined that the absolute value is the threshold voltage or more (step S217: YES), the control unit 10 turns on the first to sixth semiconductor switches 11a to 11f (step S219), and detects the voltage V1 of the first terminal 1a using the voltage detection unit 13 (step S220). Next, the control unit 10 controls the switches other than the one of the first to sixth semiconductor switches 11a to 11f that is represented by the variable IND to turn off, and determines whether the elapsed time from when the switching control is performed is the predetermined diagnosis wait time or more (step S222). If it is determined that the elapsed time is less than the diagnosis wait time (step S222: NO), the control unit 10 returns the processing to step S222, and continues the above diagnosis processing.

If it is determined that the elapsed time is the diagnosis wait time or longer (step S222: YES), the control unit 10 detects the voltage V2 using the voltage detection unit 13 (step S223).

Next, the control unit 10 determines whether the absolute value of the difference between the voltage V1 detected in step S220 and the voltage V2 detected in step S223 is the threshold voltage or more (step S224). If the absolute value is the threshold voltage or more (step S224: YES), the control unit 10 diagnoses that there is an open circuit failure in the one of the first to sixth semiconductor switches 11a to 11f represented by the variable IND (step S225), and ends the processing. The processing of step S226 and step S227 performed when the absolute value is less than the threshold voltage is similar to step S22 and step S23 of the first embodiment.

The control device 1 and the failure determination method according to the second embodiment configured as above have effects similar to the first embodiment, and further can determine whether there is a failure in the switching circuit 11 regardless of the voltage level of the in-vehicle battery 3.

Third Embodiment

In a control device 1 and a failure determination method according to a third embodiment, since only the processing procedure regarding failure determination is different from that of the first embodiment, the following description will be given focusing on the differences. Since the other processes, operations, and effects are the same as that of the first embodiment, the corresponding portions are given the same reference numerals and a detailed description thereof will be omitted.

Figure 13:
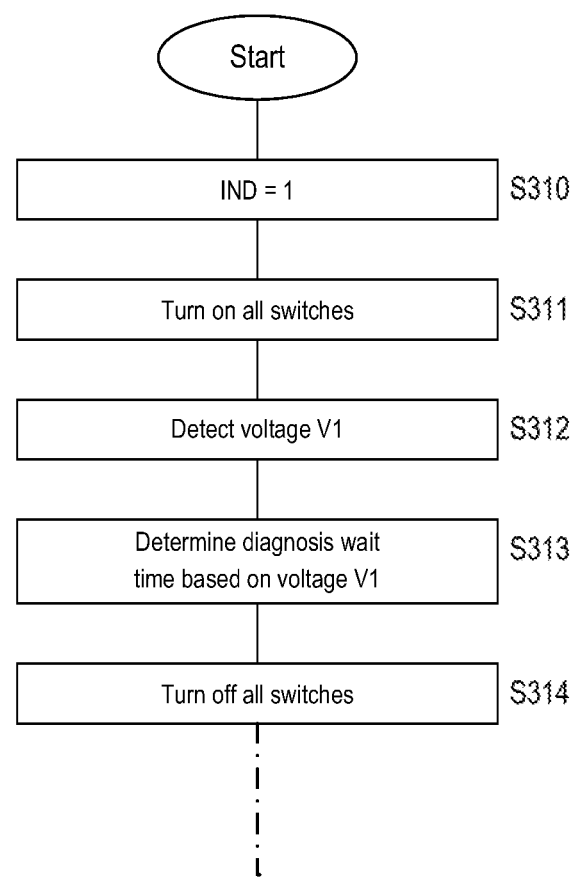
FIG. 13 is a flowchart illustrating processing procedures of a failure determination method according to a third embodiment.

FIG. 13 is a flowchart illustrating the processing procedure of the failure determination method according to the third embodiment. The control unit 10 substitutes 1 for a variable IND (step S310). Then, the control unit 10 turns on the first to sixth semiconductor switches 11a to 11f (step S311), and detects the voltage V1 of the first terminal 1a using the voltage detection unit 13 (step S312). Next, the control unit 10 determines the diagnosis wait time based on the detected voltage V1 (step S313). For example, the control unit 10 determines the threshold voltage such that the larger the voltage V1 is, the shorter the diagnosis wait time is. Then, the control unit 10 controls the first to sixth semiconductor switches 11a to 11f to turn off from on (step S314).

The processing thereafter is similar to step S13 to step S23 of the first embodiment.

According to the control device 1 and the failure determination method according to the third embodiment configured as above, it is possible to determine whether there is a failure in the switching circuit 11 more quickly using the diagnosis wait time corresponding to the voltage level of the in-vehicle battery 3.

Note that the third embodiment described an example in which the diagnosis wait time is determined, but the threshold voltage may be changed based on the voltage V1 detected in step S312, or both the threshold voltage and the diagnosis wait time may be changed.

The invention claimed is:

1. A vehicular control device provided with a switching circuit and for opening/closing a connection between a starter including a capacitor that is to be connected to one end portion of the switching circuit and an in-vehicle battery that is to be connected to another end portion of the switching circuit by controlling an on/off state of the switching circuit, the vehicular control device comprising:
   a voltage detection unit configured to detect a voltage of the one end portion; and
   a control unit configured to control the switching circuit to turn off from on, and determine whether there is a failure in the switching circuit, based on a voltage detected by the voltage detection unit when a predetermined time has elapsed from when the switching circuit is controlled to turn off from on,
   wherein the switching circuit includes a plurality of semiconductor switches connected in parallel,
   the control unit is configured to open/close the connection between the starter and the in-vehicle battery by simultaneously turning on/off the plurality of semiconductor switches,
   the control unit sets a length of the predetermined time, based on the voltage detected by the voltage detection unit in the state in which the switching circuit is on, and
   the control unit controls all or some of the plurality of semiconductor switches to turn off from on in a state in which the switching circuit is on, and determines whether there is a failure in the plurality of semiconductor switches, based on the voltage detected by the voltage detection unit when the predetermined time has elapsed from when all or some of the plurality of semiconductor switches are controlled to turn off from on.

2. The vehicular control device according to claim 1, wherein the control unit controls the plurality of semiconductor switches to turn off in the state in which the switching circuit is on, and, when the voltage detected by the voltage detection unit when the predetermined time has elapsed from when the plurality of semiconductor switches are controlled to turn off is greater than a predetermined threshold value, determines that there is a short circuit failure in which the semiconductor switches of the plurality of semiconductor switches have short-circuited.

3. The vehicular control device according to claim 2, wherein the control unit controls one of the plurality of semiconductor switches to turn on and the other of the plurality of semiconductor switches to turn off, and, when the voltage detected by the voltage detection unit when the predetermined time has elapsed from when the one semiconductor switch is controlled to turn on is less than the predetermined threshold value, determines that there is an open circuit failure in which the other of the plurality of semiconductor switch does not turn on.

4. The vehicular control device according to claim 2, wherein the control unit controls one of the plurality of semiconductor switches to turn on and the other of the plurality of semiconductor switches to turn off, and, when a difference between the voltage detected by the voltage detection unit in the state in which the switching circuit is on and the voltage detected by the voltage detection unit when the predetermined time has elapsed from when the one semiconductor switch is controlled to turn on is a predetermined threshold voltage or more, determines that there is an open circuit failure in which the other of the plurality of semiconductor switch does not turn on.

5. The vehicular control device according to claim 2, wherein, the greater the voltage detected by the voltage detection unit in the state in which the switching circuit is on is, the shorter the control unit sets the length of the predetermined time.

6. The vehicular control device according to claim 1, wherein the control unit controls the plurality of semiconductor switches to turn off in the state in which the switching circuit is on, and, when a difference between the voltage detected by the voltage detection unit in the state in which the switching circuit is on and the voltage detected by the voltage detection unit when the predetermined time has elapsed from when the plurality of semiconductor switches are controlled to turn off is less than a predetermined threshold voltage, determines that there is a short circuit failure in which the semiconductor switch of the plurality of semiconductor switches have short-circuited.

7. The vehicular control device according to claim 6, wherein the control unit controls one of the plurality of semiconductor switches to turn on and the other of the plurality of semiconductor switches to turn off, and, when the voltage detected by the voltage detection unit when the predetermined time has elapsed from when the one semiconductor switch is controlled to turn on is less than a predetermined threshold value, determines that there is an open circuit failure in which the other of the plurality of semiconductor switch does not turn on.

8. The vehicular control device according to claim 6, wherein the control unit controls one of the plurality of semiconductor switches to turn on and the other of the plurality of semiconductor switches to turn off, and, when a difference between the voltage detected by the voltage detection unit in the state in which the switching circuit is on and the voltage detected by the voltage detection unit when the predetermined time has elapsed from when the one semiconductor switch is controlled to turn on is a predetermined threshold voltage or more, determines that there is an open circuit failure in which the other of the plurality of semiconductor switch does not turn on.

9. The vehicular control device according to claim 1, wherein the control unit controls one of the plurality of semiconductor switches to turn on and the other of the plurality of semiconductor switches of the plurality of semiconductor switches to turn off, and, when the voltage detected by the voltage detection unit when the predetermined time has elapsed from when the one of the plurality of semiconductor switch switches is controlled to turn on is less than a predetermined threshold value, determines that there is an open circuit failure in which the other of the plurality of semiconductor switches does not turn on.

10. The vehicular control device according to claim 9, wherein the control unit determines an open circuit failure for each of the plurality of semiconductor switches by selectively controlling each of the plurality of semiconductor switches to turn on one by one.

11. The vehicular control device according to claim 10, wherein, the greater the voltage detected by the voltage detection unit in the state in which the switching circuit is on is, the shorter the control unit sets the length of the predetermined time.

12. The vehicular control device according to claim 1, wherein the control unit controls one of the plurality of semiconductor switches to turn on and the other of the plurality of semiconductor switches to turn off, and, when a difference between the voltage detected by the voltage detection unit in the state in which the switching circuit is on and the voltage detected by the voltage detection unit when the predetermined time has elapsed from when the one of the plurality of semiconductor switches is controlled to turn on is a predetermined threshold voltage or more, determines that there is an open circuit failure in which the other of the plurality of semiconductor switches does not turn on.

13. The vehicular control device according to claim 12, wherein the control unit determines an open circuit failure for each of the plurality of semiconductor switches by selectively controlling each of the plurality of semiconductor switches to turn on one by one.

14. The vehicular control device according to claim 1, wherein, the greater the voltage detected by the voltage detection unit in the state in which the switching circuit is on is, the shorter the control unit sets the length of the predetermined time.

15. A failure determination method for determining a failure in a vehicular control device provided with a switching circuit including a plurality of semiconductor switches connected in parallel and for opening/closing a connection between a starter including a capacitor that is to be connected to one end portion of the switching circuit and an in-vehicle battery that is to be connected to another end portion of the switching circuit, by controlling an on/off state of the switching circuit by simultaneously turning on/off the plurality of semiconductor switches, the method comprising:
- a step of setting a length of the predetermined time, based on a voltage detected by the voltage detection unit in the state in which the switching circuit is on;
- a step of controlling all or some of the plurality of semiconductor switches to turn off from on in a state in which the switching circuit is on;
- a step of detecting the voltage of the one end portion when a predetermined time has elapsed from when all or some of the plurality of semiconductor switches are controlled to turn off from on; and
- a step of determining whether there is a failure in the plurality of semiconductor switches based on the detected voltage.

* * * * *